United States Patent
Yamazaki

(10) Patent No.: US 11,566,132 B2
(45) Date of Patent: Jan. 31, 2023

(54) THERMOSETTING SILICONE RESIN COMPOSITION AND DIE ATTACH MATERIAL FOR OPTICAL SEMICONDUCTOR DEVICE

(71) Applicant: SHIN-ETSU CHEMICAL CO., LTD., Tokyo (JP)

(72) Inventor: Tatsuya Yamazaki, Tomioka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 388 days.

(21) Appl. No.: 17/000,422

(22) Filed: Aug. 24, 2020

(65) Prior Publication Data
US 2021/0062002 A1 Mar. 4, 2021

(30) Foreign Application Priority Data
Sep. 2, 2019 (JP) ............... JP2019-159965

(51) Int. Cl.
| | |
|---|---|
| *C08L 83/04* | (2006.01) |
| *H01L 33/60* | (2010.01) |
| *C09J 9/02* | (2006.01) |
| *H01L 23/00* | (2006.01) |
| *H01L 33/62* | (2010.01) |
| *C09J 183/04* | (2006.01) |

(52) U.S. Cl.
CPC ............. *C08L 83/04* (2013.01); *C09J 9/02* (2013.01); *C09J 183/04* (2013.01); *H01L 24/29* (2013.01); *H01L 24/32* (2013.01); *H01L 24/48* (2013.01); *H01L 24/73* (2013.01); *H01L 33/60* (2013.01); *H01L 33/62* (2013.01); *C08L 2203/14* (2013.01); *C08L 2205/025* (2013.01); *C08L 2205/035* (2013.01); *H01L 2224/29191* (2013.01); *H01L 2224/32245* (2013.01); *H01L 2224/48245* (2013.01); *H01L 2224/73265* (2013.01); *H01L 2924/0715* (2013.01); *H01L 2924/12041* (2013.01); *H01L 2924/15738* (2013.01)

(58) Field of Classification Search
CPC .......... C08L 83/00; C08K 5/56; C08G 77/12; C08G 77/20; H01L 33/56
See application file for complete search history.

(56) References Cited

U.S. PATENT DOCUMENTS

| | | | |
|---|---|---|---|
| 2008/0249244 A1 | 10/2008 | Meguriya et al. | |
| 2013/0134609 A1 | 5/2013 | Yoshitake et al. | |
| 2013/0330852 A1 | 12/2013 | Okuyama | |
| 2016/0204321 A1 | 7/2016 | Naka et al. | |
| 2018/0237591 A1* | 8/2018 | Yamazaki | ............... C08L 83/04 |

FOREIGN PATENT DOCUMENTS

| | | |
|---|---|---|
| JP | 2008-255227 A | 10/2008 |
| JP | 2012-012434 A | 1/2012 |
| JP | 2013-254893 A | 12/2013 |
| JP | 2016-122828 A | 7/2016 |

* cited by examiner

*Primary Examiner* — Khanh T Nguyen
(74) *Attorney, Agent, or Firm* — Oliff PLC

(57) ABSTRACT

A thermosetting silicone resin composition contains the following components (A-1) to (D): (A-1) an alkenyl group-containing linear organopolysiloxane; (A-2) a branched organopolysiloxane shown by $(R^1_3SiO_{1/2})_a(R^2_3SiO_{1/2})_b(SiO_{4/2})_c$ (1); (B-1) a branched organohydrogenpolysiloxane shown by $(HR^2_2SiO_{1/2})_d(R^2_3SiO_{1/2})_e(SiO_{4/2})_f$ (2); (B-2) a linear organohydrogenpolysiloxane shown by $(R^2_3SiO_{1/2})_2(HR^2SiO_{2/2})_x(R^2_2SiO_{2/2})_y$ (3); (C) an adhesion aid which is an epoxy group-containing branched organopolysiloxane; and (D) a catalyst containing a combination of a zero-valent platinum complex with a divalent platinum complex and/or a tetravalent platinum complex. This provides a thermosetting silicone resin composition which causes little contamination at a gold pad portion and has excellent adhesiveness to a silver lead frame.

18 Claims, No Drawings

THERMOSETTING SILICONE RESIN COMPOSITION AND DIE ATTACH MATERIAL FOR OPTICAL SEMICONDUCTOR DEVICE

TECHNICAL FIELD

The present invention relates to: a thermosetting silicone resin composition; and a die attach material for optical semiconductor device, the die attach material being made of the resin composition.

BACKGROUND ART

Recently, optical semiconductors (e.g., light-emitting diodes: LEDs) have been rapidly adopted because of such advantages as less power consumption and longer service life than those of conventional light-emitting devices such as electric bulbs and fluorescent lamps. When an optical semiconductor device is manufactured, first, a curable resin composition called a die attach material is applied to a predetermined position on an optical semiconductor substrate in order to fix the optical semiconductor chip to the substrate. As the method for applying a die attach material, there are generally two methods: a dispensing method in which a resin filled in a syringe is ejected by pressure through a needle attached to the tip of the syringe and transferred onto a substrate; and a stamping method in which a transfer pin is pressed against a resin spread in a thin-film form on a resin plate, and then the pin with the resin adhering thereto is pressed against a substrate and transferred thereto. Next, a die bonding step is performed in which an LED chip whose bottom portion is mostly formed of sapphire is crimped onto the applied resin composition. Subsequently, the resin composition is cured. After this curing step, a wire bonding step is performed in which an electrode pad portion (mostly formed of gold) of the optical semiconductor chip is joined, with a gold wire, to an electro-conductive lead frame portion (mostly formed of silver) on the substrate. In the wire bonding step, a gold ball formed at a tip portion of a capillary is pressed against the electrode pad portion by applying ultrasound. In this event, if the LED chip is not sufficiently fixed on the substrate, the ultrasound is radiated to the surroundings at the time of pressing, bringing about a problem that bonding cannot be accomplished by sufficient strength of the gold wire. Meanwhile, after the LED device is completed through the post process, if the LED chip floats from the substrate during the lighting operation, heat is not sufficiently dissipated from the LED chip as a heat generating element to the substrate, and this may cause operation failure. For these reasons, a curable resin composition capable of imparting high strength and high adhesiveness to the resulting cured product is employed as the die attach material to sufficiently fix the LED chip to the substrate.

Meanwhile, in high-power blue LED devices frequently used for illumination purposes, addition-curable silicone resin compositions derived from methylsilicone or the like are widely used as a die attach material from the viewpoints of imparting heat resistance and light resistance. Nevertheless, it is reported that a contaminant is formed on a gold electrode pad portion of an optical semiconductor chip when such an addition-curable silicone resin composition is cured, due to various causes such as the kinds of the resin composition and the optical semiconductor chip to be used, the curing conditions of the resin composition, etc. The electrode pad portion with contaminant is problematic because the contaminant adversely influences the subsequent wire bonding step. Such a contaminant is presumably caused by a low-molecular-weight siloxane contained in the addition-curable silicone resin composition. Particularly, a low-molecular-weight siloxane having a hydrogen atom bonded to a silicon atom (hydrosilyl group) is vaporized by heating during curing to form a coating film on the electrode pad portion by hydrolysis reaction or the like, or form a gel that adheres as a contaminant, causing problems. It has been known that decreasing the content of low-molecular-weight siloxane having a hydrosilyl group in a resin composition can reduce the amount of contaminant adhering to an electrode pad portion of an LED chip during heat curing and improves the wire bonding performance.

Moreover, to enhance the fixation of an LED chip to a substrate, a die attach material is normally transferred onto the substrate in such an amount that the die attach material can form a fillet around the chip, and then the chip is crimped. In this event, if the resin is not retained much, the fillet thinly spreads to the surroundings immediately after the chip is crimped. In such a case, the surface area of the resin is increased, so that the low-molecular-weight siloxane having a SiH group (hydrosilyl group) in the resin composition readily volatilizes during the curing. This increases the contaminant adhesion to the electrode pad portion of the LED chip.

Further, addition-curable silicone resin compositions derived from methylsilicone or the like are inferior to conventional epoxy resins in adhesiveness to substrates, due to the resin polarity etc. Particularly, in comparison between sapphire at the bottom portion of an LED chip and a silver lead frame portion to both of which a die attach material is attached, the adhesiveness to the latter tends to be poorer. Normally, in an LED package, a white resin called a reflector is molded to a lead frame. In a case where a reflector member is formed using an epoxy molding compound (hereinafter referred to as "EMC") having a much higher adhesiveness to a molding mold than a thermoplastic resin such as polyphthalamide, a wax is generally added in a predetermined amount so as to improve the releasability. The LED package molded with an EMC undergoes a chemical etching step with an acid or base, a physical etching step by blast cleaning, or the like. However, if the wax component oozed out to the lead frame in the molding step is not sufficiently removed by the etching step, the adhesiveness between the lead frame portion and the die attach material is degraded.

JP 2013-254893A (Patent Document 1) reports that the use of an LED chip including a metal protecting layer containing Ni or Ta provided on a gold electrode portion can achieve favorable wire bonding performance even in the case of using a die attach material made of an addition-curable silicone resin which is likely to cause electrode contamination. However, the manufacturing cost of the LED chip having such a protecting layer is higher than those of common LED chips without the protecting layer. Hence, there is a need for a die attach material that causes little electrode contamination by itself.

Meanwhile, JP 2016-122828A (Patent Document 2) reports that the light-emitting efficiency of an LED device is improved by using a sulfur-based gloss agent on a silver lead frame of an LED package molded with an EMC. However, when such a gloss agent is used on the silver surface, the adhesiveness of the die attach material might be decreased. Thus, there is a demand that the die attach material should have higher adhesiveness to a base material.

For example, JP 2008-255227A (Patent Document 3) reports that the low-molecular-weight siloxane component contained in an addition-curable silicone resin composition includes many low-molecular-weight siloxanes containing a SiH group serving as a reactive group, in addition to low-molecular-weight siloxanes having no functional group as represented by D3 and D4. Patent Document 3 states that particularly when a low-molecular-weight siloxane compound having a degree of polymerization of 10 or less and one or more SiH groups per molecule is contained in a given mass % or less of the entire silicone resin composition, the adhesion of contaminant to the surroundings during heat curing can be suppressed. However, cured products of the addition-curable silicone resin compositions in Examples were soft and had hardnesses of 32 to 66 as defined in JIS K 6249 and measured with a type A durometer. There is a concern for the adhesion strength when the addition-curable silicone resin compositions are used as a die attach material for LED device.

Further, JP 2012-12434A (Patent Document 4) reports that an addition-curable silicone resin composition which contains a combination of a linear organopolysiloxane having a hydrosilyl group at a side chain and a branched organopolysiloxane having hydrosilyl groups at terminals as organohydrogensiloxane components, and which has a type D durometer hardness of 30 to 70 as defined in JIS K 6253, is excellent in light transmittance and adhesiveness durability. However, Patent Document 4 is silent on contamination at a gold pad portion on an LED chip during the curing when the composition is applied to a die attach material for LED device.

As described above, the conventional addition-curable silicone resin compositions have problems: when the compositions are used particularly as a die attach material for LED device, contaminants adhere to an LED-chip electrode pad portions during curing, thereby decreasing the wire bonding performance; and the compositions have insufficient adhesiveness to a silver lead frame portion molded with a reflector member on an optical semiconductor substrate.

CITATION LIST

Patent Literature

Patent Document 1: JP 2013-254893A
Patent Document 2: JP 2016-122828A
Patent Document 3: JP 2008-255227A
Patent Document 4: JP 2012-012434A

SUMMARY OF INVENTION

Technical Problem

The present invention has been made in view of the above-described circumstances. An object of the present invention is to provide: a thermosetting silicone resin composition which causes little contamination at a gold pad portion on an LED chip during curing, and which has excellent adhesiveness to a silver lead frame molded with a reflector member on a substrate; and a die attach material made of the composition and used for optical semiconductor device.

Solution to Problem

To achieve the object, the present invention provides a thermosetting silicone resin composition comprising the following components (A-1), (A-2), (B-1), (B-2), (C), and (D) as essential components:

(A-1) a linear organopolysiloxane having two or more alkenyl groups each having 2 to 8 carbon atoms per molecule;

(A-2) a branched organopolysiloxane containing two or more alkenyl groups each having 2 to 8 carbon atoms per molecule, shown by the following formula (1), $$(R^1{}_3SiO_{1/2})_a(R^2{}_3SiO_{1/2})_b(SiO_{4/2})_c \quad (1)$$

wherein each $R^1$ represents an alkenyl group having 2 to 8 carbon atoms, each $R^2$ represents an alkyl group having 1 to 12 carbon atoms, and 0<a<0.15, 0<b<0.6, and 0<c<0.7, provided that these numbers satisfy a+b+c=1, and the branched organopolysiloxane has a weight-average molecular weight Mw of 4,000 to 9,000 and a dispersity Mw/Mn of 2.0 or more;

(B-1) a branched organohydrogenpolysiloxane having two or more hydrogen atoms directly bonded to silicon atoms per molecule, shown by the following formula (2), $$(HR^2{}_2SiO_{1/2})_d(R^2{}_3SiO_{1/2})_e(SiO_{4/2})_f \quad (2)$$

wherein each $R^2$ is as defined above, and 0<d<0.6, 0e<0.4, and 0<f<0.6, provided that these numbers satisfy d+e+f=1, the branched organohydrogenpolysiloxane is liquid at 25° C., and has a weight-average molecular weight Mw of 1,500 to 6,000, and a content of a hydrosilyl group-containing organosilicon compound having 1 to 10 silicon atoms is 5 mass % or less;

(B-2) a linear organohydrogenpolysiloxane shown by the following formula (3), $$(R^2{}_3SiO_{1/2})_2(HR^2SiO_{2/2})_x(R^2{}_2SiO_{2/2})_y \quad (3)$$

wherein each $R^2$ is as defined above, and x and y represent positive numbers satisfying 0.60≤(x/(x+y))≤0.95, given that 30≤x+y≤120, and a content of a hydrosilyl group-containing organosilicon compound having 1 to 10 silicon atoms is 5 mass % or less;

(C) an adhesion aid component which is a branched organopolysiloxane shown by the following formula (4), $$(MeSiO_{3/2})_m(EpSiO_{3/2})_n(EpMeSiO_{2/2})_p(Me_2SiO_{2/2})_q(ViMeSiO_{2/2})_r(R^3O_{1/2})_s \quad (4)$$

wherein Me represents a methyl group, Ep represents a monovalent organic group having an epoxy group, Vi represents a vinyl group, $R^3$ represents an alkyl group having 1 to 12 carbon atoms, 0≤m≤0.35, 0≤n<0.35, 0≤p<0.35, 0.15≤(n+p)/(m+n+p+q+r+s)≤0.35, 0.4≤q<0.7, 0<r<0.1, and 0≤s<0.05, provided that these numbers satisfy m+n+p+q+r+s=1, and the organopolysiloxane has a weight-average molecular weight of 1,500 to 6,000 and an epoxy equivalent of 250 to 500 g/eq; and (D) an addition reaction catalyst containing a combination of a zero-valent platinum complex with a divalent platinum complex and/or a tetravalent platinum complex, wherein a platinum element amount t (ppm) in the zero-valent platinum complex, a platinum element amount u (ppm) in the divalent platinum complex, and a platinum element amount v (ppm) in the tetravalent platinum complex relative to 100 parts by mass of a total of the components (A-1) to (C) satisfy 0<t<3 and 5<u+v<30.

Such a thermosetting silicone resin composition causes little contamination at a gold pad portion on an LED chip during curing and has excellent adhesiveness to a silver lead frame molded with a reflector member on a substrate.

In the component (D) of the inventive thermosetting silicone resin composition, the divalent platinum complex may be bis(acetylacetonato)platinum(II), and the tetravalent platinum complex may be (trimethyl)methylcyclopentadienylplatinum(IV).

With such component (D), the curing reaction of the thermosetting silicone resin composition takes place favorably.

The inventive thermosetting silicone resin composition can further comprise a diluent (E) which is a hydrocarbon compound being liquid at 25° C. and having a boiling point in a range of 200° C. or more and less than 350° C. under atmospheric pressure (1013 hPa).

Such component (E) makes it possible to adjust the viscosity of the inventive thermosetting silicone resin composition, and thereby improve the workability.

In the inventive thermosetting silicone resin composition, the linear organopolysiloxane of the component (A-1) may be an alkenyl group-containing linear organopolysiloxane shown by the following formula (5),

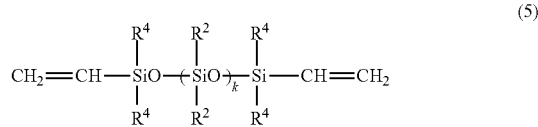

(5)

wherein $R^4$'s each independently represent an alkenyl group having 2 to 8 carbon atoms or an alkyl group having 1 to 12 carbon atoms, $R^2$'s each represent an alkyl group having 1 to 12 carbon atoms, and "k" represents an integer of more than 0 so that the linear organopolysiloxane has a kinematic viscosity of 10 to 1,000,000 mm²/s at 25° C. as measured by a method described in JIS Z 8803:2011.

The inventive thermosetting silicone resin composition suitably contains the component (A-1) as defined above.

Moreover, in the present invention, the component (B-1) preferably has a viscosity of 10 Pa·s or more at 25° C. as measured by a method described in JIS K 7117-1:1999.

When the viscosity of the component (B-1) is within the aforementioned range, the volatility of the organohydrogenpolysiloxane itself is so low that the inventive thermosetting silicone resin composition is capable of further suppressing contaminant adhesion to the surroundings during the curing.

Further preferably, in the inventive thermosetting silicone resin composition, the component (B-1) is a co-hydrolysis condensate of an $HR^2{}_2SiO_{1/2}$ unit source, an $R^2{}_3SiO_{1/2}$ unit source, and an $SiO_{4/2}$ unit source, and the $SiO_{4/2}$ unit source is a partial hydrolysate of a tetraalkoxysilane.

When a partial hydrolysis condensate of a tetraalkoxysilane is used as the $SiO_{4/2}$ unit source, the weight-average molecular weight is increased, and the organohydrogenpolysiloxane with low content of the volatile hydrosilyl group-containing low-molecular-weight siloxane can be obtained. This makes the inventive thermosetting silicone resin composition more preferable.

In the inventive thermosetting silicone resin composition, methyl groups preferably account for 90% or more of all $R^2$'s in the components (A-2), (B-1), and (B-2) by mole.

Such a thermosetting silicone resin composition is excellent in discoloration resistance when left for a long time under high temperature conditions or under blue light with a wavelength of 450 nm.

Furthermore, the present invention also provides a die attach material for optical semiconductor device, comprising the above-described thermosetting silicone resin composition.

The inventive thermosetting silicone resin composition causes little contamination at a gold pad portion on an LED chip during the curing and satisfactorily has favorable adhesiveness to a silver lead frame molded with a reflector member on a substrate. Thus, the inventive thermosetting silicone resin composition can be suitably used for electrical and electronic parts, and therefore suitably usable as a die attach material for optical semiconductor device.

Advantageous Effects of Invention

When used as a die attach material for LED, the inventive thermosetting silicone resin composition enhances reliability because of little contamination at a gold pad portion on an optical semiconductor chip during the curing, favorable wire bonding performance, and excellent adhesiveness to a silver lead frame molded with a reflector member on a substrate. Therefore, the inventive thermosetting silicone resin composition is quite useful as a die attach material for LED.

DESCRIPTION OF EMBODIMENTS

The present inventor and colleagues have earnestly studied to achieve the above object and consequently found that when a thermosetting silicone resin composition containing the following components (A-1) to (D) is used as a die attach material for optical semiconductor device, a gold pad portion on an LED chip is hardly contaminated during curing, and the adhesiveness to a silver lead frame molded with a reflector member on a substrate is excellent. This finding has led to the completion of the present invention.

Specifically, the present invention is a thermosetting silicone resin composition comprising the following components (A-1), (A-2), (B-1), (B-2), (C), and (D) as essential components:

(A-1) a linear organopolysiloxane having two or more alkenyl groups each having 2 to 8 carbon atoms per molecule;

(A-2) a branched organopolysiloxane containing two or more alkenyl groups each having 2 to 8 carbon atoms per molecule, shown by the following formula (1), $$(R^1{}_3SiO_{1/2})_a(R^2{}_3SiO_{1/2})_b(SiO_{4/2})_c \quad (1)$$

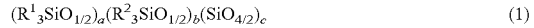

wherein each $R^1$ represents an alkenyl group having 2 to 8 carbon atoms, each $R^2$ represents an alkyl group having 1 to 12 carbon atoms, and 0<a<0.15, 0<b<0.6, and 0<c<0.7, provided that these numbers satisfy a+b+c=1, and the branched organopolysiloxane has a weight-average molecular weight Mw of 4,000 to 9,000 and a dispersity Mw/Mn of 2.0 or more;

(B-1) a branched organohydrogenpolysiloxane having two or more hydrogen atoms directly bonded to silicon atoms per molecule, shown by the following formula (2), $$(HR^2{}_2SiO_{1/2})_d(R^2{}_3SiO_{1/2})_e(SiO_{4/2})_f \quad (2)$$

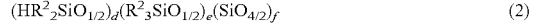

wherein each $R^2$ is as defined above, and 0<d<0.6, 0≤e<0.4, and 0<f<0.6, provided that these numbers satisfy d+e+f=1, the branched organohydrogenpolysiloxane is liquid at 25° C., and has a weight-average molecular weight Mw of 1,500 to 6,000, and a content of a hydrosilyl group-containing organosilicon compound having 1 to 10 silicon atoms is 5 mass % or less;

(B-2) a linear organohydrogenpolysiloxane shown by the following formula (3), $$(R^2{}_3SiO_{1/2})_2(HR^2SiO_{2/2})_x(R^2{}_2SiO_{2/2})_y \quad (3)$$

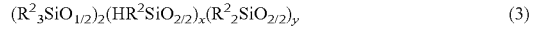

wherein each $R^2$ is as defined above, and x and y represent positive numbers satisfying $0.60 \leq (x/(x+y)) \leq 0.95$, given that $30 \leq x+y \leq 120$, and a content of a hydrosilyl group-containing organosilicon compound having 1 to 10 silicon atoms is 5 mass % or less;

(C) an adhesion aid component which is a branched organopolysiloxane shown by the following formula (4),

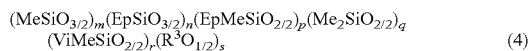

$(MeSiO_{3/2})_m(EpSiO_{3/2})_n(EpMeSiO_{2/2})_p(Me_2SiO_{2/2})_q$
$(ViMeSiO_{2/2})_r(R^3O_{1/2})_s$ (4)

wherein Me represents a methyl group, Ep represents a monovalent organic group having an epoxy group, Vi represents a vinyl group, $R^3$ represents an alkyl group having 1 to 12 carbon atoms, $0 \leq m<0.35$, $0 \leq n<0.35$, $0 \leq p<0.35$, $0.15 \leq (n+p)/(m+n+p+q+r+s) \leq 0.35$, $0.4 \leq q<0.7$, $0<r<0.1$, and $0 \leq s<0.05$, provided that these numbers satisfy $m+n+p+q+r+s=1$, and the organopolysiloxane has a weight-average molecular weight of 1,500 to 6,000 and an epoxy equivalent of 250 to 500 g/eq; and (D) an addition reaction catalyst containing a combination of a zero-valent platinum complex with a divalent platinum complex and/or a tetravalent platinum complex, wherein a platinum element amount t (ppm) in the zero-valent platinum complex, a platinum element amount u (ppm) in the divalent platinum complex, and a platinum element amount v (ppm) in the tetravalent platinum complex relative to 100 parts by mass of a total of the components (A-1) to (C) satisfy $0<t<3$ and $5<u+v<30$.

Hereinafter, the present invention will be described in detail, but the present invention is not limited to these.

The inventive thermosetting silicone resin composition contains the components (A-1), (A-2), (B-1), (B-2), (C), and (D) as essential components.

The inventive thermosetting silicone resin composition enhances reliability when used as a die attach material for LED because of: little contamination at a gold pad portion on an optical semiconductor chip during the curing, favorable wire bonding performance, and excellent adhesiveness to a silver lead frame molded with a reflector member on a substrate.

The reasons why such effects are exhibited are conceivably that: the use of the specific organohydrogenpolysiloxanes in a particular combination reduces the content of a volatile low-molecular-weight siloxane having a hydrosilyl group in the resulting thermosetting silicone resin composition as compared to the case of using organohydrogenpolysiloxanes employed in usual thermosetting silicone resin compositions; the curing proceeds with such strength that an LED chip can be sufficiently fixed within a predetermined curing time; while good curability is exhibited, such a balance is maintained that the adhesion-contributing component in the resin is sufficiently compatible with the base material; etc.

The inventive thermosetting silicone resin composition contains the aforementioned components (A-1), (A-2), (B-1), (B-2), (C), and (D) as the essential components, but can contain other components than these, as necessary. Hereinafter, components constituting the inventive thermosetting silicone resin composition will be described.

<(A-1) Linear Organopolysiloxane>

The component (A-1) is a linear organopolysiloxane having two or more alkenyl groups each having 2 to 8 carbon atoms per molecule. The component (A-1) may have functional groups other than the alkenyl group without particular limitation, and examples of the other groups include alkyl groups. The component (A-1) is preferably a linear organopolysiloxane having the alkenyl groups bonded to silicon atoms only at two ends of the molecular chain; particularly, one shown by the following general formula (5) is suitable:

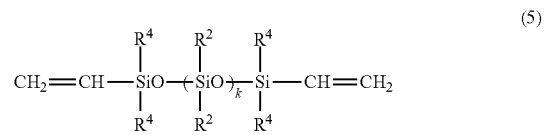

(5)

where $R^4$'s each independently represent an alkenyl group having 2 to 8 carbon atoms or an alkyl group having 1 to 12 carbon atoms. $R^2$'s each represent an alkyl group having 1 to 12 carbon atoms. "k" is an integer of more than 0 so that the linear organopolysiloxane has a kinematic viscosity of 10 to 1,000,000 mm²/s at 25° C. as measured by a method described in JIS Z 8803:2011.

In the formula (5), $R^4$ is an alkenyl group having 2 to 8 carbon atoms, particularly preferably having 2 to 6 carbon atoms. Specific examples of the alkenyl group include vinyl, allyl, isopropenyl, butenyl, pentenyl, hexenyl, and cyclohexenyl groups, etc. Moreover, the alkyl group having 1 to 12 carbon atoms particularly preferably has 1 to 10 carbon atoms, and specific examples thereof include such alkyl groups as methyl, ethyl, propyl, isopropyl, butyl, isobutyl, tert-butyl, pentyl, neopentyl, hexyl, cyclohexyl, octyl, nonyl, and decyl groups, etc. The alkenyl group as $R^4$ is particularly preferably a vinyl group. The alkyl group is preferably such alkyl groups as methyl, ethyl, propyl, and isopropyl groups, particularly preferably a methyl group, in consideration of discoloration resistance when a silicone cured product prepared from the resulting addition-curable silicone resin composition (thermosetting silicone resin composition) is left for a long time under high temperature conditions or under blue light with a wavelength of 450 nm.

The alkyl group having 1 to 12 carbon atoms as $R^2$ particularly preferably has 1 to 10 carbon atoms. Examples thereof include the same groups as those exemplified as the above-mentioned alkyl groups for $R^4$. Among these, a methyl group is particularly preferable for the same reason.

The linear organopolysiloxane containing the alkenyl groups only at both ends as shown by the formula (5) is superior in reactivity to organopolysiloxanes having an alkenyl group at a side chain, and has such an advantage that the cured resin is excellent in elongation, so that cracks and the like are difficult to occur.

The linear organopolysiloxane of the component (A-1) preferably has a kinematic viscosity at 25° C. in a range of 10 to 1,000,000 mm²/s, more preferably 10 to 100,000 mm²/s. When the kinematic viscosity at 25° C. is higher than this lower limit, the resulting cured product has sufficient strength. When the kinematic viscosity at 25° C. is lower than the upper limit, the composition has sufficient coatability. In a case where the component (A-1) is a mixture of two or more kinds, the kinematic viscosity of the mixture is preferably within the range of 10 to 1,000,000 mm²/s at 25° C. Note that, in the present invention, the value of the kinematic viscosity is measured with an Ostwald viscometer at 25° C. according to a method described in JIS Z 8803: 2011.

Specific examples of the component (A-1) include the following:

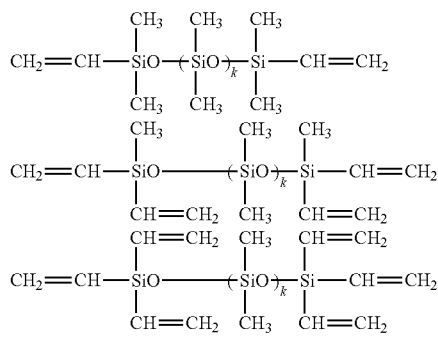

where each k is as defined above.

<(A-2) Branched Organopolysiloxane>

The component (A-2) is a branched organopolysiloxane containing two or more alkenyl groups each having 2 to 8 carbon atoms per molecule as shown by the following formula (1). The branched organopolysiloxane has a weight-average molecular weight Mw of 4,000 to 9,000 and a dispersity Mw/Mn of 2.0 or more.

$$(R^1{}_3SiO_{1/2})_a(R^2{}_3SiO_{1/2})_b(SiO_{4/2})_c \qquad (1)$$

In the formula, each $R^1$ represents an alkenyl group having 2 to 8 carbon atoms, each $R^2$ represents an alkyl group having 1 to 12 carbon atoms, and 0<a<0.15, 0<b<0.6, and 0<c<0.7, provided that these numbers satisfy a+b+c=1.

In the formula (1), $R^1$ is an alkenyl group having 2 to 8 carbon atoms, particularly preferably having 2 to 6 carbon atoms. Specific examples thereof include vinyl, allyl, isopropenyl, butenyl, pentenyl, hexenyl, and cyclohexenyl groups, etc. Particularly, a vinyl group is preferable.

In the formula (1), $R^2$ is an alkyl group having 1 to 12 carbon atoms, particularly preferably having 1 to 10 carbon atoms. Specific examples thereof include such alkyl groups as methyl, ethyl, propyl, isopropyl, butyl, isobutyl, tert-butyl, pentyl, neopentyl, hexyl, cyclohexyl, octyl, nonyl, and decyl groups, etc. The alkyl group as $R^2$ is preferably such alkyl groups as methyl, ethyl, propyl, and isopropyl groups, particularly preferably a methyl group, in consideration of discoloration resistance when a silicone cured product prepared from the resulting addition-curable silicone resin composition is left for a long time under high temperature conditions or under blue light with a wavelength of 450 nm.

As described above, the branched organopolysiloxane having an alkenyl group only on the $R_3SiO_{1/2}$ unit (M unit) is excellent in reactivity with hydrosilyl group-containing organohydrogenpolysiloxanes in comparison with organopolysiloxanes having an alkenyl group on the $R_2SiO_{2/2}$ unit (D unit) or $RSiO_{3/2}$ unit (T unit). This makes it possible to prevent hydrosilyl group-containing low-molecular-weight siloxane from dispersing to the surroundings and forming contaminants during the curing.

The component (A-2) has a weight-average molecular weight Mw in the range of 4,000 to 9,000, particularly preferably in a range of 5,000 to 8,000. When the weight-average molecular weight of the branched organopolysiloxane is within the ranges, the polarity of the component (A-2) is likely to differ from that of the component (C). This makes it possible to impart sufficient adhesiveness to the base material during the curing of the resin composition. If the weight-average molecular weight of the branched orga- nopolysiloxane is lower than the ranges, sufficient adhesiveness may not be obtained. If the weight-average molecular weight of the branched organopolysiloxane is higher than the ranges, the workability may be lowered. Note that, in the present invention, a weight-average molecular weight Mw refers to a weight-average molecular weight measured by gel permeation chromatography (GPC) using polystyrene as a standard substance under the following conditions.

The component (A-2) has a dispersity Mw/Mn of 2.0 or more, preferably 2.5 or more. If the dispersity Mw/Mn is below 2.0, the workability may be lowered. Note that the Mn refers to a number-average molecular weight measured by gel permeation chromatography (GPC) using polystyrene as a standard substance under the following conditions.

[Measurement Conditions]
Developing solvent: tetrahydrofuran (THF)
Flow rate: 0.6 mL/min
Detector: differential refractive index detector (RI)
Column: TSK Guardcolumn SuperH-L
TSKgel Super H4000 (6.0 mm I.D.×15 cm×1)
TSKgel Super H3000 (6.0 mm I.D.×15 cm×1)
TSKgel Super H2000 (6.0 mm I.D.×15 cm×2) (all manufactured by Tosoh Corporation)
Column temperature: 40° C.
Sample injection volume: 20 pL (THF solution with a concentration of 0.5 mass %)

Moreover, the content ratio "a" of the $R^1{}_3SiO_{1/2}$ unit in the formula (1) is in the range of 0<a<0.15 relative to the total a+b+c=1 of the siloxane units, and is preferably in a range of 0.05≤a≤0.1. Further, the content ratio "b" of the $R^2{}_3SiO_{1/2}$ unit is 0<b<0.6 relative to the total a+b+c=1 of the siloxane units, and is preferably in a range of 0.3≤b<0.5. Furthermore, the content ratio "c" of the $SiO_{4/2}$ unit is 0<c<0.7 relative to the total a+b+c=1 of the siloxane units, and is preferably in a range of 0.4c0.6.

The component (A-2) can be easily synthesized by: mixing compounds serving as the sources for each unit such that the above-described content ratios fall within the respective ranges; and performing co-hydrolytic condensation in the presence of an acid, for example.

Here, examples of the $R^1{}_3SiO_{1/2}$ unit source include organosilicon compounds such as triorganochlorosilane, triorganoalkoxysilane, and hexaorganodisiloxane shown by the following structural formulae, but adoptable $R^1{}_3SiO_{1/2}$ unit sources are not limited thereto.

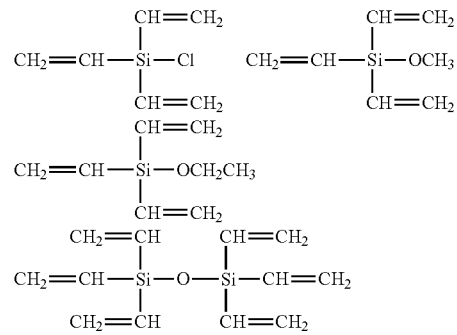

Moreover, examples of the $R^2{}_3SiO_{1/2}$ unit source include organosilicon compounds such as triorganochlorosilane, triorganoalkoxysilane, and hexaorganodisiloxane shown by the following structural formulae, but adoptable $R^2{}_3SiO_{1/2}$ unit sources are not limited thereto.

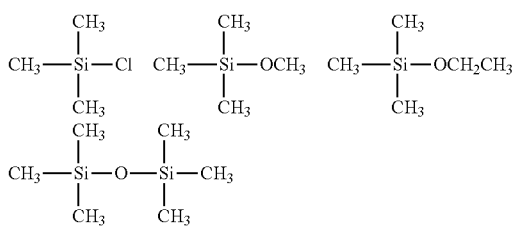

Further, examples of the $SiO_{4/2}$ unit source include organosilicon compounds such as tetrachlorosilane and tetraalkoxysilane shown by the following structural formulae, but adoptable $SiO_{4/2}$ unit sources are not limited thereto.

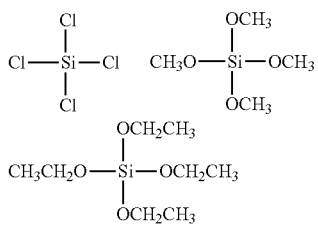

The amounts of the component (A-1) and the component (A-2) blended into the thermosetting silicone resin composition are preferably in a range of (A-1):(A-2)=55:45 to 85:15, particularly preferably 60:40 to 80:20, by mass ratio. The amount of the component (A-1) blended is preferably within these ranges because a silicone cured product to be obtained has necessary and sufficient strength and hardness.

<(B-1) Branched Organohydrogenpolysiloxane>

The component (B-1) of the present invention is a branched organohydrogenpolysiloxane having two or more hydrogen atoms directly bonded to silicon atoms per molecule as shown by the following formula (2). The polysiloxane is liquid at 25° C., and has a weight-average molecular weight of 1,500 to 6,000. A content of a hydrosilyl group-containing organosilicon compound having 1 to 10 silicon atoms in the branched organohydrogenpolysiloxane is 5 mass % or less.

$$(HR^2{}_2SiO_{1/2})_d(R^2{}_3SiO_{1/2})_e(SiO_{4/2})_f \quad (2)$$

In the formula, each $R^2$ is as defined above, and $0<d<0.6$, $0\le e<0.4$, and $0<f<0.6$, provided that these numbers satisfy $d+e+f=1$.

Herein, the phrase "liquid at 25° C." means having flowability that allows viscosity measurement at 25° C. with a rotational viscometer.

The component (B-1) acts as a cross-linking agent. An addition reaction takes place between a hydrogen atom bonded to a silicon atom (a hydrosilyl group) in the component (B-1) and the alkenyl groups (particularly preferably a vinyl group) bonded to silicon atoms in the component (A-1) and the component (A-2), so that a cured silicone product is formed from the inventive thermosetting silicone resin composition.

In the formula (2), each $R^2$ is as defined above. The alkyl group as $R^2$ is preferably such alkyl groups as methyl, ethyl, propyl, and isopropyl groups, particularly preferably a methyl group, in consideration of discoloration resistance when a silicone cured product prepared from the resulting addition-curable silicone resin composition is left for a long time under high temperature conditions or under blue light with a wavelength of 450 nm.

Such a branched organohydrogenpolysiloxane is highly reactive because it has a hydrosilyl group only on the M unit, and is capable of preventing hydrosilyl group-containing siloxane from dispersing to the surroundings and forming contaminants during the curing, regardless of whether the hydrosilyl group-containing siloxane is low molecular weight molecule or not. Moreover, incorporating the $SiO_{4/2}$ unit (Q unit) improves the strength of the resulting cured product.

The content ratio "d" of the $HR^2{}_2SiO_{1/2}$ unit in the formula (2) is in the range of $0<d<0.6$ relative to the total $d+e+f=1$ of the siloxane units, and is preferably in a range of $0.2\le d\le 0.5$. Moreover, the content ratio "e" of the $R^2{}_3SiO_{1/2}$ unit is $0\le e<0.4$ relative to the total $d+e+f=1$ of the siloxane units, and is preferably in a range of $0\le e\le 0.3$. Further, the content ratio "f" of the $SiO_{4/2}$ unit is $0<f<0.6$ relative to the total $d+e+f=1$ of the siloxane units, and is preferably in a range of $0.45\le f\le 0.55$.

The organohydrogenpolysiloxane of the component (B-1) has a weight-average molecular weight in the range of 1,500 or more and 6,000 or less, preferably in a range of 2,500 or more and 5,000 or less. If the weight-average molecular weight of the organohydrogenpolysiloxane is less than 1,500, the degree of contaminant adhesion to the surroundings may be increased. The organohydrogenpolysiloxane having a weight-average molecular weight exceeding 6,000 is not preferable because the workability may be lowered.

The component (B-1) contains 5 mass % or less, preferably 2.5 mass % or less, further preferably 1 mass % or less, of a hydrosilyl group-containing organosilicon compound having 1 to 10 silicon atoms. If the content of the hydrosilyl group-containing low-molecular-weight organosilicon compound exceeds the aforementioned values, the hydrosilyl group-containing low-molecular-weight organosilicon compound volatilizes during the curing in such an amount that the contaminant adhesion to the surroundings cannot be suppressed. Note that the content of the hydrosilyl group-containing low-molecular-weight organosilicon compound may be 0 mass %.

Note that, in the present invention, the content of a hydrosilyl group-containing organosilicon compound having 1 to 10 silicon atoms refers to the content of the organosilicon compound quantitatively measured by gas chromatography under the following conditions.

[Measurement Conditions]
- Equipment: GC-2014 (manufactured by SHIMADZU CORPORATION)
- Column: product name: HP-5 MS (manufactured by Agilent Technologies, inner diameter: 0.25 mm, length: 30 m, packing material: [(5%-phenyl)-methylpolysiloxane]
- Detector: FID detector (detector temperature: 300° C.)
- Sample: a sample solution in which 1.0 g of a sample is dissolved in 10 mL of a standard solution of n-tetradecane in acetone (concentration: 20 pg/mL)
- Injection volume: 1 μL
- Oven temperature: 50° C. to 280° C. over 23 minutes to 280° C. over 17 minutes
- Carrier gas: type: helium, linear velocity: 34.0 cm/s The liquid branched organohydrogenpolysiloxane of the component (B-1) has a viscosity, as measured by a method described in JIS K 7117-1:1999 at 25° C., of preferably 10 Pa·s or more, more preferably 200 Pa·s or more. When the component (B-1) has such viscosity within these ranges, the organohydrogenpolysiloxane itself has such a low volatility that contaminant adhesion to the surroundings can be suppressed during the curing. Note that, in the present invention, a liquid substance refers to one having flowability allowing viscosity measurement at 25° C. with a rotational viscometer, particularly one having a viscosity of 10,000 Pa·s or less at 25° C.

Further, the branched organohydrogenpolysiloxane of the component (B-1) has a hydrosilyl group amount of preferably 0.1 to 2 mol/100 g, particularly preferably 0.2 to 0.9 mol/100 g.

As in the case of the component (A-2), the component (B-1) can be easily synthesized by: mixing compounds serving as the sources for each unit such that the above-described content ratios fall within the respective ranges; and performing co-hydrolytic condensation in the presence of an acid, for example.

Here, examples of the $HR^2_2SiO_{1/2}$ unit source include organosilicon compounds such as tetramethyldisiloxane shown by the following structural formula, but adoptable $HR^2_2SiO_{1/2}$ unit sources are not limited thereto.

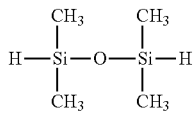

Moreover, examples of the $R^2_3SiO_{1/2}$ unit source include the same organosilicon compounds for the $R^2_3SiO_{1/2}$ unit source in the component (A-2).

The $SiO_{4/2}$ unit source is not particularly limited, and examples thereof include the same organosilicon compounds for the $SiO_{4/2}$ unit source in the component (A-2). Especially, a partial hydrolysate of a tetraalkoxysilane is preferably used as the raw material, and a partial hydrolysis condensate of tetramethoxysilane and/or tetraethoxysilane shown by the following structural formulae is particularly preferable.

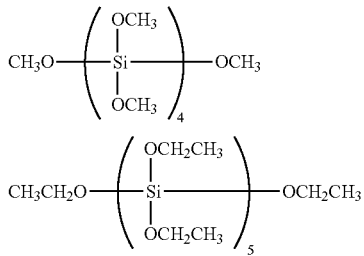

As the tetraalkoxysilane partial hydrolysate, commercially available products may be used. An example thereof includes M Silicate 51 (product name: manufactured by Tama Chemicals Co., Ltd.) as methyl polysilicate.

As described above, the component (B-1) is preferably a co-hydrolysis condensate of the $HR^2_2SiO_{1/2}$ unit source, the $R^2_3SiO_{1/2}$ unit source, and the $SiO_{4/2}$ unit source. In addition, the $SiO_{4/2}$ unit source is preferably a partial hydrolysate of a tetraalkoxysilane.

When a partial hydrolysis condensate of a tetraalkoxysilane is used as the $SiO_{4/2}$ unit source, the resulting organohydrogenpolysiloxane has higher weight-average molecular weight and lower content of volatile hydrosilyl group-containing low-molecular-weight siloxane.

Note that when a partial hydrolysis condensate of tetraalkoxysilane is used as the $SiO_{4/2}$ unit source, the partial hydrolysis condensate preferably has low content of monomer components such as tetraalkoxysilane. The content of the monomer components is preferably 10 mass % or less, particularly preferably 5 mass % or less. When the monomer content of the hydrolysis condensate is low, the component (B-1) contains a smaller amount of volatile hydrosilyl group-containing low-molecular-weight siloxane, so that the contamination to the surroundings is decreased during the curing.

<(B-2) Linear Organohydrogenpolysiloxane>

The component (B-2) of the present invention is a linear organohydrogenpolysiloxane shown by the following formula (3), and a content of a hydrosilyl group-containing organosilicon compound having 1 to 10 silicon atoms is 5 mass % or less.

$$(R^2_3SiO_{1/2})_2(HR^2SiO_{2/2})_x(R^2_2SiO_{2/2})_y \qquad (3)$$

In the formula, each $R^2$ is as defined above, and x and y represent positive numbers satisfying $0.60 \le (x/(x+y)) \le 0.95$, given that $30 \le x+y \le 120$.

As in the case of the component (B-1), the component (B-2) acts as a cross-linking agent. An addition reaction takes place between a hydrogen atom bonded to a silicon atom (a hydrosilyl group) in the component (B-2) and the alkenyl groups (particularly preferably a vinyl group) bonded to silicon atoms in the component (A-1) and the component (A-2), so that a cured silicone product is formed from the inventive thermosetting silicone resin composition.

The content "x" of the $HR^2SiO_{2/2}$ unit and the content "y" of the $R^2_2SiO_{2/2}$ unit in the formula (3) have relations satisfying: the range of $0.60 \le (x/(x+y)) \le 0.95$, preferably a range of $0.70(x/(x+y)) \le 0.90$; and the range of $30 \le x+y \le 120$, preferably a range of $40x+y \le 110$.

In the formula (3), each $R^2$ is as defined above. The alkyl group as $R^2$ is preferably such alkyl groups as methyl, ethyl, propyl, and isopropyl groups, particularly preferably a methyl group, in consideration of discoloration resistance when a silicone cured product prepared from the resulting addition-curable silicone resin composition is left for a long time under high temperature conditions or under blue light with a wavelength of 450 nm.

Such a linear organohydrogenpolysiloxane abundantly contains siloxane units having hydrogen atoms bonded to silicon atoms on the D unit. Hence, the curability can be adjusted by the steric hindrance during the addition curing reaction. Moreover, the linear organohydrogenpolysiloxane has high wettability on a base material, and a hydrosilyl group that remains without being involved in the addition curing reaction with the alkenyl group due to the steric hindrance is converted to a hydroxysilyl group by the addition reaction catalyst. This makes it possible to contribute to an improvement in the adhesiveness to the base material.

As in the case of the component (B-1), the component (B-2) contains 5 mass % or less, preferably 2.5 mass % or less, further preferably 1 mass % or less, of a hydrosilyl group-containing organosilicon compound having 1 to 10 silicon atoms. The content of the hydrosilyl group-containing low-molecular-weight siloxane exceeding 5 mass % is not preferable because the hydrosilyl group-containing low-molecular-weight siloxane volatilizes during the curing in such an amount that the contaminants are likely to adhere and form on the surroundings. Note that the content of the hydrosilyl group-containing low-molecular-weight siloxane may be 0 mass %.

Further, the linear organohydrogenpolysiloxane of the component (B-2) has a hydrosilyl group amount of suitably 0.7 to 1.5 mol/100 g, particularly suitably 1.0 to 1.4 mol/100 g.

A specific example of the linear organohydrogenpolysiloxane of the component (B-2) includes the following:

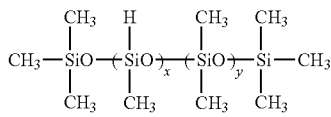

where x and y are as defined above.

The amounts of the component (B-1) and the component (B-2) blended into the thermosetting silicone resin composition are preferably in a range of (B-1):(B-2)=95:5 to 70:30, particularly preferably 90:10 to 75:25, by mass ratio. The amount of the component (B-1) blended is preferably equal to or smaller than the upper limit because the curing reaction does not proceed too fast, and the adhesiveness to the base material is sufficiently exhibited. Meanwhile, the amount of the component (B-1) blended is preferably equal to or larger than the lower limit because a silicone cured product with sufficient hardness is obtained within a predetermined curing time.

Moreover, a total amount of the components (B-1) and (B-2) blended is such that a total of hydrogen atoms bonded to silicon atoms in the components (B-1) and (B-2) is preferably in a range of 1.0 to 2.0 moles, particularly preferably 1.1 to 1.5 moles, based on 1 mole of all alkenyl groups bonded to silicon atoms in the entire thermosetting silicone resin composition. When the total amount of hydrogen atoms bonded to silicon atoms in the components (B-1) and (B-2) is within these ranges, the curing reaction smoothly proceeds, and a silicone cured product with high adhesiveness to a base material can be obtained.

Note that, in the inventive thermosetting silicone resin composition, methyl groups account for suitably 90% or more, preferably 95% or more, of all $R^{2}$'s in the components (A-2), (B-1), and (B-2) by mole. With these ranges, the inventive thermosetting silicone resin composition exhibits excellent discoloration resistance when left for a long time under high temperature conditions or under blue light with a wavelength of 450 nm.

<(C) Adhesion Aid>

The component (C) is an adhesion aid blended to exhibit adhesiveness to a base material during the curing of the inventive thermosetting silicone resin composition. This adhesion aid component (C) is a branched organopolysiloxane shown by the following formula (4), and has a weight-average molecular weight of 1,500 to 6,000 and an epoxy equivalent of 250 to 500 g/eq.

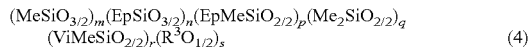

(4)

In the formula, Me represents a methyl group, Ep represents a monovalent organic group having an epoxy group, Vi represents a vinyl group, $R^3$ represents an alkyl group having 1 to 12 carbon atoms, $0 \leq m < 0.35$, $0 \leq n < 0.35$, $0 \leq p < 0.35$, $0.15 \leq (n+p)/(m+n+p+q+r+s) \leq 0.35$, $0.4 \leq q < 0.7$, $0 < r < 0.1$, and $0 \leq s < 0.05$, provided that these numbers satisfy $m+n+p+q+r+s=1$.

Specific examples of the monovalent organic group having an epoxy group represented by Ep in the formula (4) include organic groups such as 3-glycidoxypropyl, 2-(3,4-epoxycyclohexyl)ethyl, 5,6-epoxyhexyl, and 7,8-epoxyoctyl groups. Ep is particularly preferably a 3-glycidoxypropyl group from the viewpoint of storage stability when the component (c) is blended into the silicone resin composition.

The branched organopolysiloxane having high weight-average molecular weight and low epoxy equivalent as described above differs from the component (A-2) greatly in polarity, and hence is likely to move to the interface with the base material during the curing, so that favorable adhesiveness is successfully exhibited. Moreover, the organopolysiloxane has a vinyl group on the D unit, and therefore is incorporated into the silicone resin composition by the addition curing reaction, thereby making it possible to suppress bleed-out after the curing. Further, the organopolysiloxane is more mildly incorporated into the composition than one having a vinyl group on the M unit, and achieves sufficient compatibility with the base material. Furthermore, since a large amount of dimethylsiloxane units is contained, the organopolysiloxane exhibits better compatibility with the base resin containing the components (A-1) to (B-2), and suppresses discoloration when the inventive composition is left for a long time under high temperature conditions or under blue light with a wavelength of 450 nm.

The content ratio "m" of the $MeSiO_{3/2}$ unit in the formula (4) is in the range of $0 \leq m < 0.35$ relative to the total $m+n+p+q+r+s=1$ of the siloxane units, and is particularly preferably in a range of $0 \leq m \leq 0.3$. Moreover, the content ratio "n" of the $EpSiO_{3/2}$ unit is in the range of $0 \leq n < 0.35$ relative to the total $m+n+p+q+r+s=1$ of the siloxane units, and is particularly preferably in a range of $0 \leq n \leq 0.3$. Further, the content ratio "p" of the $EpMeSiO_{2/2}$ unit is in the range of $0 \leq p < 0.35$ relative to the total $m+n+p+q+r+s=1$ of the siloxane units, and is particularly preferably in a range of $0 \leq p \leq 0.3$. Furthermore, the content ratio "q" of the $Me_2SiO_{2/2}$ unit is $0.4 \leq q < 0.7$ relative to the total $m+n+p+q+r+s=1$ of the siloxane units, and is particularly preferably in a range of $0.45 \leq q \leq 0.65$. Furthermore, the content ratio "r" of the $ViMeSiO_{2/2}$ unit is $0 < r < 0.1$ relative to the total $m+n+p+q+r+s=1$ of the siloxane units, and is particularly preferably in a range of $0 < r \leq 0.08$. Furthermore, the content ratio "s" of the $R^3O_{1/2}$ unit is $0 \leq s < 0.05$ relative to the total $m+n+p+q+r+s=1$ of the siloxane units, and is particularly preferably in a range of $0 \leq s \leq 0.03$.

The branched organopolysiloxane shown by the formula (4) has a weight-average molecular weight in the range of 1,500 to 6,000, preferably in a range of 2,000 to 5,000. If the weight-average molecular weight exceeds these ranges, the appearance of the silicone resin cured product may become cloudy. If the weight-average molecular weight is below the ranges, sufficient adhesiveness to the base material may not be obtained.

Further, the branched organopolysiloxane shown by the formula (4) has an epoxy equivalent in the range of 250 to 500 g/eq, preferably in a range of 300 to 450 g/eq. If the epoxy equivalent exceeds these ranges, sufficient adhesiveness to the base material may not be obtained. If the epoxy equivalent is below the ranges, the appearance of the silicone resin cured product may become cloudy.

The component (C) can be easily synthesized by: mixing compounds serving as the sources for each unit such that the above-described content ratios fall within the respective ranges; and performing co-hydrolytic condensation in the presence of a base, for example.

Here, examples of the $EpSiO_{3/2}$ and $EpMeSiO_{2/2}$ unit sources include organosilicon compounds shown by the following structural formulae, but adoptable $EpSiO_{3/2}$ and $EpMeSiO_{2/2}$ unit sources are not limited thereto.

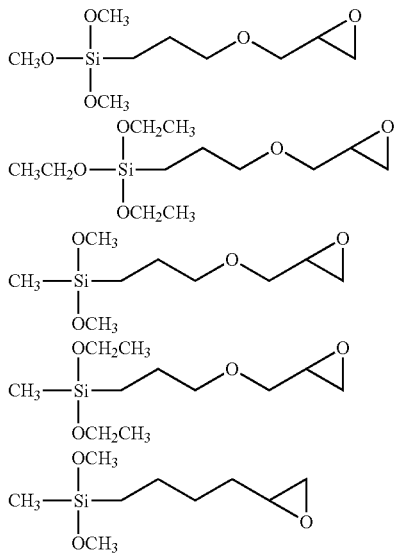

The amount of the component (C) blended is in a range of preferably 0.5 to 10 parts by mass, particularly preferably 1 to 8 parts by mass, relative to 100 parts by mass of the entire thermosetting silicone resin composition. The amount of the component (C) blended is preferably 0.5 parts by mass or more because the adhesiveness to the base material becomes excellent. The amount is preferably 10 parts by mass or less because the appearance of the silicone resin cured product becomes not cloudy but transparent.

<(D) Addition Reaction Catalyst>

The component (D) is an addition reaction catalyst blended to facilitate the addition curing reaction of the inventive thermosetting silicone resin composition.

The component (D) contains a combination of a zero-valent platinum complex with a divalent platinum complex (may also be referred to as a positive divalent platinum complex or a platinum complex in a +2 oxidation state) and/or a tetravalent platinum complex (may also be referred to as a positive tetravalent platinum complex or a platinum complex in a +4 oxidation state). A platinum element amount t (ppm) in the zero-valent platinum complex, a platinum element amount u (ppm) in the divalent platinum complex, and a platinum element amount v (ppm) in the tetravalent platinum complex which are added relative to 100 parts by mass of a total of the components (A-1) to (C) satisfy ranges of $0<t<3$ and $5<u+v<30$. The zero-valent platinum complex contributes to the initiation of heat curing reaction, and examples thereof include platinum (0)-tetramethyltetravinylcyclotetrasiloxane complex, platinum (0)-1,3-divinyltetramethyldisiloxane complex, etc. From the divalent platinum complex and the tetravalent platinum complex, ligands thereof are separated by heating, and the activities are exhibited slowly in comparison with the zero-valent platinum complex. The combination with the zero-valent platinum complex enables better control of the curability than when the zero-valent platinum complex is used alone. An example of the divalent platinum complex includes bis(acetylacetonato)platinum(II). An example of the tetravalent platinum complex includes (trimethyl)methylcyclopentadienylplatinum(IV). If the platinum element amount t (ppm) in the zero-valent platinum complex, the platinum element amount u (ppm) in the divalent platinum complex, and the platinum element amount v (ppm) in the tetravalent platinum complex are outside the aforementioned ranges, the curing does not start favorably, and the curing reaction does not proceed adequately. Therefore, in this state, if using the above composition as a die attach material for optical semiconductor device, many contaminants are formed at a gold electrode pad portion during the curing, and the adhesiveness to a base material cannot be exhibited sufficiently.

The inventive thermosetting silicone resin composition contains the above-described components (A-1), (A-2), (B-1), (B-2), (C), and (D) as the essential components, and can also contain a diluent (E) and so forth, as necessary.

<(E) Diluent>

The component (E) is a diluent which is a hydrocarbon compound, liquid at 25° C., and has a boiling point in a range of 200° C. or more and less than 350° C. under atmospheric pressure (1013 hPa). The diluent of the component (E) is preferably an aliphatic hydrocarbon compound.

The diluent of the component (E) is blended to adjust the viscosity of the inventive thermosetting silicone composition. The amount of the diluent blended is preferably in a range of 0.5 to 10 parts by mass, particularly preferably 1 to 8 parts by mass, relative to 100 parts by mass of the entire thermosetting silicone resin composition. When the amount of the component (E) blended is smaller than the upper limit, the strength of the resulting cured resin is not lowered, which would otherwise occur if a portion of the solvent remains during the heat curing. When the amount is larger than the lower limit, the workability is favorable, too.

Moreover, the boiling point of the component (E) under atmospheric pressure (1013 hPa) is 200° C. or more and less than 350° C., preferably in a range of 220° C. or more and 330° C. or less. When the boiling point of the component (E) is not less than the lower limit, the workability will not be lowered in a die bonding step of an LED chip onto the resin having been applied on a substrate; additionally, the thickening due to the solvent volatilization is inhibited, so that the resin spreads in a sufficient range at the bottom portion of the chip. Meanwhile, when the boiling point of the component (E) is not more than the upper limit, the solvent is sufficiently eliminated during the heat curing, and the strength of the resulting cured resin is not lowered.

Further, it is suitable to perform desulfurization treatment on the component (E) because the component (E) might inhibit the addition of the inventive thermosetting silicone resin composition. Particularly, the component (E) more suitably has a sulfur content of less than 1 ppm. Moreover, from the viewpoint of the compatibility with the inventive thermosetting silicone resin composition, the component (E) has an aniline point of particularly suitably 100° C. or less.

The diluent of the component (E) may be a single hydrocarbon compound or a mixture of multiple compounds. When a mixture is used, the upper and lower limits of boiling points (initial boiling point to final point (or dry point)) should be within the preferable boiling point ranges described above. As the diluent, commercially available products can be used. Specific examples thereof include "Hydroseal G232H" (boiling point: 238 to 261° C.), "Hydroseal G240H" (boiling point: 255 to 282° C.), "Hydroseal G250H" (boiling point: 258 to 326° C.), "Hydroseal G270H" (boiling point: 258 to 287° C.), "Hydroseal G3H" (boiling point: 277 to 321° C.), and "Hydroseal G400H" (boiling point: 305 to 347° C.), all manufactured by TOTAL S.A.; "Exxsol™ D95" (boiling point: 222 to 242° C.), "Exxsol™ D110" (boiling point: 248 to 265° C.), "Exxsol™ D130" (boiling point: 279 to 313° C.), and "Isoper™ M" (boiling point: 224 to 254° C.) all manufactured by Exxson Mobil Corporation; and "IP2028" (boiling point: 213 to 262° C.) manufactured by Idemitsu Kosan Co., Ltd. One of these may be used alone, or a mixture of two or more thereof may be used.

Such diluents as these hydrocarbon compounds have high compatibility with silicone resins, and have higher surface tension than silicone resins, making it possible to improve the resin retention after a chip is crimped. When the resin retention is high, it is possible to keep the surface area of the resin portion small, and hence reduce the risk of dispersing hydrosilyl group-containing low-molecular-weight siloxane in the resin composition during the curing. Further, since the fillet around a chip can keep the shape immediately after the crimping, a decrease in the chip reinforcing effect can be suppressed.

<Other Components>

The inventive thermosetting silicone resin composition can be optionally blended with various known additives as appropriate, in addition to the components (A) to (E).

[Inorganic Filler]

The inventive thermosetting silicone resin composition can be appropriately blended with an inorganic filler in order to improve the strength of the resulting cured product, and impart thixotropy to improve the application workability of the die attach material. Examples of the inorganic filler include fumed silica, fumed titanium dioxide, etc. Particularly, from the viewpoint of the transparency of the resulting cured product, it is suitable to use fumed silica as the inorganic filler.

When an inorganic filler is blended, the amount of the inorganic filler blended can be preferably 20 parts by mass or less, more preferably in a range of 1 to 10 parts by mass, relative to 100 parts by mass of the entire thermosetting silicone resin composition. Particularly, when fumed silica is used as the inorganic filler, the silica surface is suitably treated with a hydrophobic group from the viewpoint of the compatibility with the addition-curable silicone resin. Specific examples of the hydrophobic group include siloxane-derived groups such as trimethylsilyl and dimethylsilyl groups.

Moreover, the surface treatment has an effect of improving the storage stability by suppressing the interaction between an epoxy group contained in the component (C) and a hydroxysilyl group on the fumed silica surface. Hence, the fumed silica is preferably subjected to sufficient surface treatment. Specifically, it is desirable to use the fumed silica having a specific surface area of 150 $m^2$/g or more and 250 $m^2$/g or less, preferably 170 $m^2$/g or more and 230 $m^2$/g or less. Examples of commercially available products of such fumed silica subjected to surface treatment with the siloxane-derived functional group include R812 (specific surface area: 230 to 290 $m^2$/g) and RX300 (specific surface area: 180 to 220 $m^2$/g) which are surface-treated with trimethylsilyl group, R976 (specific surface area: 225 to 275 $m^2$/g) and R976S (specific surface area: 215 to 265 $m^2$/g) which are surface-treated with dimethylsilyl group (all manufactured by Nippon Aerosil Co., Ltd.); etc.

[Curing Inhibitor]

The inventive thermosetting silicone resin composition can be blended with a curing inhibitor to, for example, adjust the curing rate. Examples of the curing inhibitor include compounds selected from the group consisting of: vinyl group-containing organopolysiloxanes such as tetramethyl-tetravinylcyclotetrasiloxane, hexavinyldisiloxane, and 1,3-divinyltetramethyldisiloxane; acetylene alcohols such as ethynylcyclohexanol and 3-methyl-1-butyn-3-ol, and silane-modified products and siloxane-modified products thereof; hydroperoxide, tetramethylethylenediamine, benzotriazole, triallyl isocyanurate, alkyl maleate, and mixtures thereof; etc. When a curing inhibitor is blended, the curing inhibitor can be added in an amount of preferably 0.001 to 1.0 parts by mass, particularly preferably 0.005 to 0.5 parts by mass, relative to 100 parts by mass of the entire silicone resin composition.

[Heat Resistance Improver]

The inventive thermosetting silicone resin composition can be blended with a heat resistance improver to improve the crack resistance under high temperature environment. The heat resistance improver has an effect against oxidative deterioration of silicone resins which proceeds under high temperature environments such as 180° C. or higher, for example, an effect of suppressing the increase in the resin hardness by cutting the dimethylsiloxane chain length, and so forth. Examples of the heat resistance improver include cerium(III) tris(2-ethylhexanoate), trialkoxy cerium(III), siloxane modified products of cerium(III), etc.

The amount of the heat resistance improver blended is preferably in a range of 0.1 to 100 ppm, more preferably 1 to 50 ppm, which are based on the mass of the metal element therein, relative to 100 parts by mass of the entire thermosetting silicone resin composition. When the amount of the heat resistance improver blended is within these ranges, the crack resistance will not be lowered under high temperature environments, and the light transmittance of the silicone resin cured product will not be lowered greatly due to its coloring. In a case where the method of applying the die attach material is a stamping method, since the die attach material is put in a thin-film form on a resin plate, a heat resistance improver with low hydrolyzability is suitably used.

<Curing Method>

The inventive thermosetting silicone resin composition may be cured after applied onto a substrate, depending on the usage. The curing temperature by heating can be in a range of preferably 100 to 200° C., more preferably 150 to 170° C. When the heating temperature is within these ranges, the adhesion strength between the base material and the cured resin will not be lowered, and bubble generation and resin deterioration due to rapid solvent volatilization will not proceed, either. Note that the heat curing time may be 1 to 4 hours, and a stepwise-curing method may be adopted.

The inventive thermosetting silicone resin composition uses the above-described specific organohydrogenpolysiloxanes in a particular combination, and thereby causes little contamination at a gold pad portion on an LED chip during the curing, and satisfactorily has favorable adhesiveness to a silver lead frame molded with a reflector member on a substrate. Thus, the inventive thermosetting silicone resin composition is suitably usable for electrical and electronic parts; specifically, suitably usable as a die attach material for optical semiconductor device.

EXAMPLE

Hereinafter, the present invention will be specifically described with reference to Synthesis Examples, Examples, and Comparative Examples, but the present invention is not limited to the following Examples. Note that part(s) mean "part(s) by mass"; Me represents "a methyl group"; Vi represents "a vinyl group"; and Ep' represents "a γ-glycidoxypropyl group". Moreover, a SiVi group amount refers to the amount of a vinyl group bonded to a silicon atom.

Synthesis Example 1

Organohydrogenpolysiloxane (b1-1)

A hydrochloric acid aqueous solution was added dropwise into a solution containing 6 mol of organodisiloxane shown by $(HM_2Si)_2O$ and 3 mol of methyl polysilicate (product name: M Silicate 51, manufactured by Tama Chemicals Co., Ltd., monomer content: 4.3 mass % or less) in isopropyl alcohol. The mixture was stirred at room temperature (25° C.) for 5 hours. Toluene was added for dilution, the waste acid was separated, and the organic layer was washed with water until it became neutral. After dehydration of the organic layer, the solvent was distilled off by stripping at 150° C. under reduced pressure. Thus, an organohydrogenpolysiloxane (b1-1) was obtained as a colorless transparent liquid substance having a viscosity at 25° C. of 1,200 Pa·s. The obtained (b1-1) was constituted of siloxane units: 50 mol % of $HMe_2SiO_{1/2}$ unit and 50 mol % of $SiO_{4/2}$ unit. The weight-average molecular weight Mw according to the GPC measurement was 3,500, and the hydrosilyl group amount was 0.72 mol/100 g. Moreover, as a result of measuring the content of hydrosilyl group-containing organosilicon compound having 1 to 10 silicon atoms in (b1-1), it was 0.34 mass %.

Synthesis Example 2

Organohydrogenpolysiloxane (b1-2)

A hydrochloric acid aqueous solution was added dropwise into a solution containing 6 mol of an organodisiloxane shown by $(HMe_2Si)_2O$ and 12 mol of tetraalkoxysilane shown by $(MeO)_4Si$ in isopropyl alcohol. The mixture was stirred at room temperature (25° C.) for 5 hours. Toluene was added for dilution, the waste acid was separated, and the organic layer was washed with water until it became neutral. After dehydration of the organic layer, the solvent was distilled off by stripping at 150° C. under reduced pressure. Thus, an organohydrogenpolysiloxane (b1-2) was obtained as a colorless transparent liquid substance having a viscosity at 25° C. of 280 Pa·s. The obtained (b1-2) was constituted of siloxane units: 52 mol % of $HMe_2SiO_{112}$ unit and 48 mol % of $SiO_{4/2}$ unit. The weight-average molecular weight Mw according to the GPC measurement was 3,100, and the hydrosilyl group amount was 0.74 mol/100 g. Moreover, as a result of measuring the content of hydrosilyl group-containing organosilicon compound having 1 to 10 silicon atoms in (b1-2), it was 28.4 mass %.

<Component (A-1)>

(a1-1): an organopolysiloxane shown by the following formula:

$$(ViMe_2SiO_{1/2})_2(Me_2SiO_{2/2})_{50}$$

The SiVi group amount was 0.045 mol/100 g, the kinematic viscosity at 25° C. was 55 mm²/s, and the organopolysiloxane was liquid at 25° C.

<Component (A-2)>

(a2-1): an organopolysiloxane containing siloxane units: 6.2 mol % of $Vi_3SiO_{1/2}$ unit, 45.8 mol % of $Me_3SiO_{1/2}$ unit, and 48.0 mol % of $SiO_{4/2}$ unit. The SiVi group amount was 0.198 mol/100 g, the weight-average molecular weight Mw according to the GPC measurement was 7,500, and the dispersity Mw/Mn was 3.0. The organopolysiloxane was solid at 25° C.

(a2-2): an organopolysiloxane containing siloxane units: 6.2 mol % of $Vi_3SiO_{1/2}$ unit, 45.8 mol % of $Me_3SiO_{1/2}$ unit, and 48.0 mol % of $SiO_{4/2}$ unit. The SiVi group amount was 0.195 mol/100 g, the weight-average molecular weight Mw according to the GPC measurement was 3,800, and the dispersity Mw/Mn was 1.8. The organopolysiloxane was solid at 25° C.

<Component (B-1)>

(b1-1): the organohydrogenpolysiloxane obtained in Synthesis Example 1

(b1-2): the organohydrogenpolysiloxane obtained in Synthesis Example 2

<Component (B-2)>

(b2-1): an organohydrogenpolysiloxane shown by the following formula:

$$(Me_3SiO_{1/2})_2(HMeSiO_{2/2})_{36}(Me_2SiO_{2/2})_{12}$$

The hydrosilyl group amount was 1.13 mol/100 g, the content of hydrosilyl group-containing organosilicon compound having 1 to 10 silicon atoms was 0.01 mass %, and the kinematic viscosity at 25° C. was 45 mm²/s. The organohydrogenpolysiloxane was liquid at 25° C.

(b2-2): an organohydrogenpolysiloxane shown by the following formula:

$$(Me_3SiO_{1/2})_2(HMeSiO_{2/2})_{86}(Me_2SiO_{2/2})_{10}$$

The hydrosilyl group amount was 1.35 mol/100 g, the content of hydrosilyl group-containing organosilicon compound having 1 to 10 silicon atoms was 0.01 mass %, and the kinematic viscosity at 25° C. was 140 mm²/s. The organohydrogenpolysiloxane was liquid at 25° C.

(b2-3): an organohydrogenpolysiloxane shown by the following formula:

$$(Me_3SiO_{1/2})_2(HMeSiO_{2/2})_{38}$$

The hydrosilyl group amount was 1.55 mol/100 g, the content of hydrosilyl group-containing organosilicon compound having 1 to 10 silicon atoms was 0.02 mass %, and the kinematic viscosity at 25° C. was 23 mm²/s. The organohydrogenpolysiloxane was liquid at 25° C.

<Component (C)>

(c-1): an organopolysiloxane containing siloxane units: 29 mol % of $Ep'SiO_{3/2}$ unit, 64 mol % of $Me_2SiO_{2/2}$ unit, 6 mol % of $ViMeSiO_{2/2}$ unit, and 1 mol % of $MeO_{1/2}$ unit. The weight-average molecular weight Mw according to the GPC measurement was 2,400, the SiVi group amount was 0.05 mol/100 g, the epoxy equivalent was 330 g/eq, and the kinematic viscosity at 25° C. was 350 mm²/s. The organopolysiloxane was liquid at 25° C.

(c-2): an organopolysiloxane containing siloxane units: 25 mol % of $MeSiO_{3/2}$ unit, 22 mol % of $Ep'MeSiO_{2/2}$ unit, 47 mol % of $Me_2SiO_{2/2}$ unit, 5 mol % of $ViMeSiO_{2/2}$ unit, and 1 mol % of $MeO_{1/2}$ unit. The weight-average molecular weight Mw according to the GPC measurement was 3,100, the SiVi group amount was 0.05 mol/100 g, the epoxy equivalent was 435 g/eq, and the kinematic viscosity at 25° C. was 360 mm²/s. The organopolysiloxane was liquid at 25° C.

(c-3): an organopolysiloxane containing siloxane units: 20 mol % of $MeSiO_{3/2}$ unit, 9 mol % of $Ep'MeSiO_{2/2}$ unit, 65 mol % of $Me_2SiO_{2/2}$ unit, 5 mol % of $ViMeSiO_{2/2}$ unit, and 1 mol % of $MeO_{1/2}$ unit. The weight-average molecular weight Mw according to the GPC measurement was 1,900, the SiVi group amount was 0.05 mol/100 g, the epoxy equivalent was 850 g/eq, and the kinematic viscosity at 25° C. was 105 mm²/s. The organopolysiloxane was liquid at 25° C.

<Component (D)>

(d-1): a tetramethyltetravinylcyclotetrasiloxane solution of platinum (0)-tetramethyltetravinylcyclotetrasiloxane complex. The platinum content was 2 mass %, and the SiVi group amount was 1.15 mol/100 g.

(d-2): a toluene solution of bis(acetylacetonato)platinum(II). The platinum content was 1 mass %.

(d-3): a toluene solution of (trimethyl)methylcyclopentadienylplatinum(IV). The platinum content was 1 mass %

<Component (E)>

(e-1): a hydrocarbon solvent "Hydroseal G240H" manufactured by TOTAL S.A. [boiling point under atmospheric pressure (1013 hPa): 255 to 282° C.]

<Inorganic Filler>

(f-1): fumed silica "RX300" manufactured by Nippon Aerosil Co., Ltd.

Examples 1 to 4, Comparative Examples 1 to 8

Addition-curable silicone resin compositions (thermosetting silicone resin compositions) of Examples 1 to 4 and Comparative Examples 1 to 8 were prepared according to the blending ratios shown in Table 1 (the numbers are expressed in parts by mass). The hardness, non-contaminating property during curing, wire bonding performance, and adhesiveness of the compositions were evaluated by the following test methods. Table 1 shows these measurement results.

(a) Hardness

Each addition-curable silicone resin composition was heated using a hot air circulation dryer at 150° C. for 3 hours to prepare a cured silicone. The cured silicone was subjected to measurement using a type D durometer in accordance with JIS K 6253-3:2012.

(b) Non-Contaminating Property During Curing

The contaminating property during the curing of each addition-curable silicone resin composition was evaluated by the following method using a gold-plated plate.

In a hermetically-sealed aluminum container having a volume of 30 cm$^3$, 1.0 g of the addition-curable silicone resin composition was placed together with a gold-plated plate having an area of 2 cm$^2$ and plated with gold by electrolytic plating, such that the silicone resin did not come into contact with the gold-plated plate. The container was heated using a hot air circulation dryer at 150° C. for 3 hours. After the heating, the container was cooled to 25° C., while the container was being hermetically sealed. After the gold-plated plate was taken out from the container, the contaminant-adhesion state on the gold-plated plate surface was observed with the naked eyes.

Note that the non-contaminating property during curing was evaluated according to the proportion of contaminants adhering to the gold-plated plate surface relative to the total area of the gold-plated plate surface:

"good (O)" when the proportion was less than 5%;

"fair (Δ)" when the proportion was 5% or more and less than 25%; and

"poor (×)" when the proportion was 25% or more.

(c) Wire Bonding Performance

The wire bonding performance of each addition-curable silicone resin composition was evaluated by the following method.

A predetermined amount of the resin was applied to the center of each cavity of an SMD type 3030 package which had a silver-plated lead frame portion and a reflector member made of EMC, and which had been cleaned by chemical etching after the molding. After an LED chip (B2424 (610 μm☐) manufactured by GeneLite) was die-bonded, the LED-bonded package was placed in an aluminum bag, and hermetically sealed, followed by heat curing using a hot air circulation dryer at 150° C. for 3 hours. Then, while the bag was hermetically sealed, the bag was cooled to normal temperature (25° C.), and the lead frame was taken out from the bag. Subsequently, electrodes on the LED chip and the lead frame surface were connected by using a wire bonder (UTC-1000super manufactured by Shinkawa Co., Ltd.) using a gold wire having a diameter of 30 μm. The ball shear strength of the 1st ball portion on the electrode of the LED chip (a total of 100 electrodes on the p side and n side) was measured with a bond tester (Dage 4000 manufactured by Nordson Advanced Technology) according to the method described in JESD22-B116.

Note that the wire bonding performance was evaluated based on: the number of electrodes which did not allow the formation and wire bonding of the 1st ball portion (number of wire bonding failures) among the total of 100 electrodes subjected to the wire bonding operations; and the average value of the ball shear strengths of all the 1st ball portions which were successfully formed and measured for the ball shear strength. In this event, the ball shear strength was evaluated as follows. First, a thermosetting epoxy resin silver paste (product name: X-43-5603-7AQ, manufactured by Shin-Etsu Chemical Co., Ltd.) was used to obtain the average value of ball shear strengths, and this result was set as 100%. Relative to this, the percentage of the average value of ball shear strengths obtained from each of addition-curable silicone resin compositions of Examples 1 to 4 and Comparative Examples 1 to 8 was calculated for the evaluation.

(d) Adhesiveness

A predetermined amount of each resin was applied to the center of each cavity of an SMD type 3030 package which had a silver-plated lead frame portion and a reflector member made of EMC, and which had been cleaned by chemical etching after the molding. After an LED chip (B2424 (610 pmD)manufactured by GeneLite) was die-bonded, the resin was cured by heating using a hot air circulation dryer at 150° C. for 3 hours. After the heating, the package was taken out and cooled to 25° C. The adhesion strength between the LED chip and the silver plating was measured in 50 tests for each resin with a bond tester (Dage 4000 manufactured by Nordson Advanced Technology) to calculate the average adhesion strength. After the measurement, the silver plating surface was observed with a microscope. The fracture morphology was evaluated according to the area ratio of the average resin remaining on the silver plating side:

"good resin remaining (O)" when the area ratio was 70% or more;

"fair (Δ)" when the area ratio was 40% or more and less than 70%; and

"poor (×)" when the area ratio was less than 40%.

TABLE 1

|  |  | Example 1 | Example 2 | Example 3 | Example 4 | Comparative Example 1 | Comparative Example 2 |
|---|---|---|---|---|---|---|---|
| (A-1) | (a1-1) | 22.7 | 22.7 | 22.7 | 21.8 | 22.7 | 22.7 |
| (A-2) | (a2-1) | 54.4 | 54.4 | 54.4 | 54.4 |  | 54.4 |
|  | (a2-2) |  |  |  |  | 54.4 |  |
| (B-1) | (b1-1) | 16.8 | 16.8 | 16.8 | 16.8 | 16.8 |  |
|  | (b1-2) |  |  |  |  |  | 16.8 |

TABLE 1-continued

| | | | | | | | |
|---|---|---|---|---|---|---|---|
| (B-2) | (b2-1) | 3.2 | 3.2 | | 3.2 | 3.2 | 3.2 |
| | (b2-2) | | | 3.2 | | | |
| | (b2-3) | | | | | | |
| (C) | (c-1) | 2.9 | 2.9 | 2.9 | | 2.9 | 2.9 |
| | (c-2) | | | | 3.8 | | |
| | (c-3) | | | | | | |
| (D) | (d-1) | 0.01 | 0.01 | 0.01 | 0.01 | 0.01 | 0.01 |
| | t (ppm) | 2 | 2 | 2 | 2 | 2 | 2 |
| | (d-2) | 0.06 | | 0.06 | 0.06 | 0.06 | 0.06 |
| | u (ppm) | 6 | | 6 | 6 | 6 | 6 |
| | (d-3) | | 0.06 | | | | |
| | v (ppm) | | 6 | | | | |
| (E) | (e-1) | 3.0 | 3.0 | 3.0 | 3.0 | 3.0 | 3.0 |
| Inorganic filler | (f-1) | 5.0 | 5.0 | 5.0 | 5.0 | 5.0 | 5.0 |
| | SH/SiVi | 1.32 | 1.32 | 1.38 | 1.32 | 1.33 | 1.34 |
| | Hardness (type D) | 60 | 59 | 61 | 60 | 60 | 61 |
| | Non-contaminating property during curing | ○ | ○ | ○ | ○ | ○ | Δ |
| | Number of wire bonding failures X: (per 100 sites) | 0 | 0 | 0 | 0 | 0 | 36 |
| | Ball shear strength (%) | 99 | 99 | 98 | 99 | 98 | 66 |
| | Adhesion strength (MPa) | 20.8 | 20.7 | 22.4 | 20.4 | 16.8 | 20.7 |
| | Fracture morphology | ○ | ○ | ○ | ○ | Δ | ○ |

| | | Comparative Example 3 | Comparative Example 4 | Comparative Example 5 | Comparative Example 6 | Comparative Example 7 | Comparative Example 8 |
|---|---|---|---|---|---|---|---|
| (A-1) | (a1-1) | 22.7 | 18.1 | 22.7 | 22.7 | 22.7 | 18.1 |
| (A-2) | (a2-1) | 54.4 | 54.4 | 54.4 | 54.4 | 54.4 | 54.4 |
| | (a2-2) | | | | | | |
| (B-1) | (b1-1) | 16.8 | 16.8 | 16.8 | 16.8 | 16.8 | 16.8 |
| | (b1-2) | | | | | | |
| (B-2) | (b2-1) | | 3.2 | 3.2 | 3.2 | 3.2 | 3.2 |
| | (b2-2) | | | | | | |
| | (b2-3) | 3.2 | | | | | |
| (C) | (c-1) | 2.9 | | 2.9 | 2.9 | 2.9 | |
| | (c-2) | | | | | | |
| | (c-3) | | 7.5 | | | | 7.5 |
| (D) | (d-1) | 0.01 | 0.01 | 0.04 | | | 0.04 |
| | t (ppm) | 2 | 2 | 8 | | | 8 |
| | (d-2) | 0.06 | 0.06 | | 0.08 | | |
| | u (ppm) | 6 | 6 | | 8 | | |
| | (d-3) | | | | | 0.08 | |
| | v (ppm) | | | | | 8 | |
| (E) | (e-1) | 3.0 | 3.0 | 3.0 | 3.0 | 3.0 | 3.0 |
| Inorganic filler | (f-1) | 5.0 | 5.0 | 5.0 | 5.0 | 5.0 | 7.0 |
| | SH/SiVi | 1.43 | 1.31 | 1.32 | 1.32 | 1.32 | 1.33 |
| | Hardness (type D) | 62 | 61 | 60 | 59 | 60 | 60 |
| | Non-contaminating property during curing | x | ○ | ○ | Δ | Δ | ○ |
| | Number of wire bonding failures X: (per 100 sites) | 73 | 0 | 0 | 11 | 13 | 0 |
| | Ball shear strength (%) | 35 | 98 | 98 | 82 | 79 | 99 |
| | Adhesion strength (MPa) | 23.4 | 16.6 | 15.2 | 21.2 | 21.5 | 14.3 |
| | Fracture morphology | ○ | Δ | Δ | ○ | ○ | x |

The evaluation test results revealed that the thermosetting silicone resin compositions of the present invention (Examples 1 to 4) caused little contamination at the gold pad portions on the optical semiconductor chip during the curing, and had excellent adhesiveness to the silver lead frame molded with the reflector member on the substrate.

In contrast, in Comparative Example 1 of the thermosetting silicone resin composition in which the alkenyl group-containing branched organopolysiloxane had lower weight-average molecular weight and dispersity than those defined in the present invention, the adhesiveness was inferior. In Comparative Example 2 of the thermosetting silicone resin composition in which the content of the hydrosilyl group-containing organosilicon compound having 1 to 10 silicon atoms was more than 5 mass % in the branched organohydrogenpolysiloxane, and in Comparative Example 3 of the thermosetting silicone resin compositions which did not satisfy "x" and "y" in the formula (3) of the linear organohydrogenpolysiloxane, the non-contaminating property during curing and the wire bonding performance were inferior. Moreover, in Comparative Examples 5, 8 of the thermosetting silicone resin compositions containing only the zerovalent platinum complex as the component (D), the adhesiveness was inferior. In Comparative Examples 6, 7 of the thermosetting silicone resin compositions containing only the divalent platinum complex or the tetravalent platinum complex as the component (D), the non-contaminating property during curing and the wire bonding performance were inferior. In Comparative Examples 4, 8 in which the epoxy equivalent of the contained adhesion aid exceeded the upper limit of the present invention, sufficient adhesiveness to the base material was not obtained.

As described above, the thermosetting silicone resin compositions of Comparative Examples 1 to 8 which are outside the scope of the present invention did not satisfy both of the non-contaminating property during curing and adhesiveness simultaneously. This confirmed that the inventive thermosetting silicone resin composition is quite useful as a die attach material for optical semiconductor device.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A thermosetting silicone resin composition comprising the following components (A-1), (A-2), (B-1), (B-2), (C), and (D) as essential components:
   (A-1) a linear organopolysiloxane having two or more alkenyl groups each having 2 to 8 carbon atoms per molecule;
   (A-2) a branched organopolysiloxane containing two or more alkenyl groups each having 2 to 8 carbon atoms per molecule, shown by the following formula (1), $$(R^1_3SiO_{1/2})_a(R^2_3SiO_{1/2})_b(SiO_{4/2})_c \quad (1)$$
   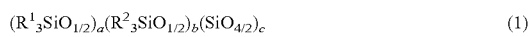

wherein each $R^1$ represents an alkenyl group having 2 to 8 carbon atoms, each $R^2$ represents an alkyl group having 1 to 12 carbon atoms, and $0<a<0.15$, $0<b<0.6$, and $0<c<0.7$, provided that these numbers satisfy $a+b+c=1$, and
   the branched organopolysiloxane has a weight-average molecular weight Mw of 4,000 to 9,000 and a dispersity Mw/Mn of 2.0 or more;
   (B-1) a branched organohydrogenpolysiloxane having two or more hydrogen atoms directly bonded to silicon atoms per molecule, shown by the following formula (2), $$(HR^2_2SiO_{1/2})_d(R^2_3SiO_{1/2})_e(SiO_{4/2})_f \quad (2)$$
   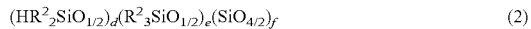

wherein each $R^2$ is as defined above, and $0<d<0.6$, $0\le e<0.4$, and $0<f<0.6$, provided that these numbers satisfy $d+e+f=1$,
   the branched organohydrogenpolysiloxane is liquid at 25° C., and has a weight-average molecular weight Mw of 1,500 to 6,000, and
   a content of a hydrosilyl group-containing organosilicon compound having 1 to 10 silicon atoms is 5 mass % or less;
   (B-2) a linear organohydrogenpolysiloxane shown by the following formula (3), $$(R^2_3SiO_{1/2})_2(HR^2SiO_{2/2})_x(R^2_2SiO_{2/2})_y \quad (3)$$
   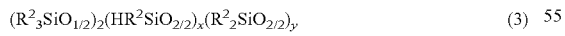

wherein each $R^2$ is as defined above, and x and y represent positive numbers satisfying $0.60\le(x/(x+y))\le0.95$, given that $30\le x+y\le120$, and
   a content of a hydrosilyl group-containing organosilicon compound having 1 to 10 silicon atoms is 5 mass % or less;
   (C) an adhesion aid component which is a branched organopolysiloxane shown by the following formula (4), $$(MeSiO_{3/2})_m(EpSiO_{3/2})_n(EpMeSiO_{2/2})_p(Me_2SiO_{2/2})_q(ViMeSiO_{2/2})_r(R^3O_{1/2})_s \quad (4)$$
   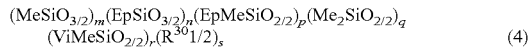

wherein Me represents a methyl group, Ep represents a monovalent organic group having an epoxy group, Vi represents a vinyl group, $R^3$ represents an alkyl group having 1 to 12 carbon atoms, $0\le m<0.35$, $0\le n<0.35$, $0\le p<0.35$, $0.15\le(n+p)/(m+n+p+q+r+s)\le0.35$, $0.4\le q<0.7$, $0<r<0.1$, and $0\le s<0.05$, provided that these numbers satisfy $m+n+p+q+r+s=1$, and
   the organopolysiloxane has a weight-average molecular weight of 1,500 to 6,000 and an epoxy equivalent of 250 to 500 g/eq; and
   (D) an addition reaction catalyst containing a combination of a zero-valent platinum complex with a divalent platinum complex and/or a tetravalent platinum complex,
   wherein a platinum element amount t (ppm) in the zero-valent platinum complex, a platinum element amount u (ppm) in the divalent platinum complex, and a platinum element amount v (ppm) in the tetravalent platinum complex relative to 100 parts by mass of a total of the components (A-1) to (C) satisfy $0<t<3$ and $5<u+v<30$.

2. The thermosetting silicone resin composition according to claim 1, wherein the divalent platinum complex in the component (D) is bis(acetylacetonato)platinum(II).

3. The thermosetting silicone resin composition according to claim 2, wherein the tetravalent platinum complex in the component (D) is (trimethyl)methylcyclopentadienylplatinum(IV).

4. A die attach material for optical semiconductor device, comprising the thermosetting silicone resin composition according to claim 3.

5. A die attach material for optical semiconductor device, comprising the thermosetting silicone resin composition according to claim 2.

6. The thermosetting silicone resin composition according to claim 1, wherein the tetravalent platinum complex in the component (D) is (trimethyl)methylcyclopentadienylplatinum(IV).

7. A die attach material for optical semiconductor device, comprising the thermosetting silicone resin composition according to claim 6.

8. The thermosetting silicone resin composition according to claim 1, further comprising a diluent (E) which is a hydrocarbon compound being liquid at 25° C. and having a boiling point in a range of 200° C. or more and less than 350° C. under atmospheric pressure (1013 hPa).

9. A die attach material for optical semiconductor device, comprising the thermosetting silicone resin composition according to claim 8.

10. The thermosetting silicone resin composition according to claim 1, wherein the linear organopolysiloxane of the component (A-1) is an alkenyl group-containing linear organopolysiloxane shown by the following formula (5),

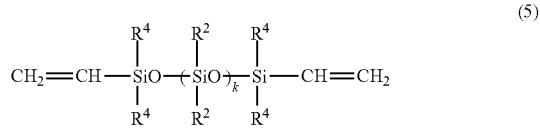

wherein $R^4$'s each independently represent an alkenyl group having 2 to 8 carbon atoms or an alkyl group having 1 to 12 carbon atoms, $R^2$'s each represent an alkyl group having 1 to 12 carbon atoms, and "k" represents an integer of more than 0 so that the linear organopolysiloxane has a kinematic viscosity of 10 to 1,000,000 mm$^2$/s at 25° C. as measured by a method described in JIS Z 8803:2011.

11. A die attach material for optical semiconductor device, comprising the thermosetting silicone resin composition according to claim 10.

12. The thermosetting silicone resin composition according to claim 1, wherein the component (B-1) has a viscosity of 10 Pa·s or more at 25° C. as measured by a method described in JIS K 7117-1:1999.

13. A die attach material for optical semiconductor device, comprising the thermosetting silicone resin composition according to claim 12.

14. The thermosetting silicone resin composition according to claim 1, wherein
   the component (B-1) is a co-hydrolysis condensate of an $HR^2_2SiO_{1/2}$ unit source, an $R^2_3SiO_{1/2}$ unit source, and an $SiO_{4/2}$ unit source, and
   the $SiO_{4/2}$ unit source is a partial hydrolysate of a tetraalkoxysilane.

15. A die attach material for optical semiconductor device, comprising the thermosetting silicone resin composition according to claim 14.

16. The thermosetting silicone resin composition according to claim 1, wherein methyl groups account for 90% or more of all $R^2$'s in the components (A-2), (B-1), and (B-2) by mole.

17. A die attach material for optical semiconductor device, comprising the thermosetting silicone resin composition according to claim 16.

18. A die attach material for optical semiconductor device, comprising the thermosetting silicone resin composition according to claim 1.

* * * * *